(12) United States Patent
Khaselev et al.

(10) Patent No.: US 11,289,447 B2
(45) Date of Patent: Mar. 29, 2022

(54) METHOD FOR DIE AND CLIP ATTACHMENT

(71) Applicants: Alpha Assembly Solutions Inc., South Plainfield, NJ (US); Advanced Packaging Center BV, Duiven (NL)

(72) Inventors: Oscar Khaselev, Monmouth Junction, NJ (US); Eef Boschman, Aerdt (NL)

(73) Assignees: Alpha Assembly Solutions, Inc., South Plainfield, NJ (US); Advanced Packaging Center BV, Duiven (NL)

( * ) Notice: Subject to any disclaimer, the term of this patent is extended or adjusted under 35 U.S.C. 154(b) by 282 days.

(21) Appl. No.: 15/545,607

(22) PCT Filed: Dec. 16, 2015

(86) PCT No.: PCT/US2015/066026
§ 371 (c)(1),
(2) Date: Jul. 21, 2017

(87) PCT Pub. No.: WO2016/100470
PCT Pub. Date: Jun. 23, 2016

(65) Prior Publication Data
US 2018/0166415 A1    Jun. 14, 2018

Related U.S. Application Data

(60) Provisional application No. 62/093,004, filed on Dec. 17, 2014.

(51) Int. Cl.
*H01L 23/00* (2006.01)
*H01L 23/495* (2006.01)
*H01L 21/48* (2006.01)

(52) U.S. Cl.
CPC .......... *H01L 24/84* (2013.01); *H01L 21/4825* (2013.01); *H01L 23/49524* (2013.01);
(Continued)

(58) Field of Classification Search
None
See application file for complete search history.

(56) References Cited

U.S. PATENT DOCUMENTS

| 8,581,383 B2 | 11/2013 | Pozder et al. |
| 2010/0176508 A1 | 7/2010 | Herbsommer et al. |

(Continued)

FOREIGN PATENT DOCUMENTS

| EP | 2147739 A2 | 1/2010 |
| EP | 2390904 A2 | 11/2011 |

(Continued)

OTHER PUBLICATIONS

Kengen M. et al., "Development of Matrix Clip Assembly for Power MOSFET Packages," 2009 European Microelectronics & Packaging Conference (EMPC 2009), Rimini, Jun. 15-18, 2009.

(Continued)

*Primary Examiner* — Alexander G Ghyka
(74) *Attorney, Agent, or Firm* — Stinson LLP

(57) ABSTRACT

A method of die and clip attachment includes providing a clip, a die and a substrate, laminating a sinterable silver film on the clip and the die, depositing a tack agent on the substrate, placing the die on the substrate, placing the clip on the die and the substrate to create a substrate, die and clip package, and sintering the substrate, die and clip package.

19 Claims, 7 Drawing Sheets

(52) U.S. Cl.
CPC .............. *H01L 24/37* (2013.01); *H01L 24/73* (2013.01); *H01L 24/83* (2013.01); *H01L 24/92* (2013.01); *H01L 24/97* (2013.01); *H01L 23/49582* (2013.01); *H01L 24/29* (2013.01); *H01L 24/32* (2013.01); *H01L 24/40* (2013.01); *H01L 2224/29139* (2013.01); *H01L 2224/29339* (2013.01); *H01L 2224/32245* (2013.01); *H01L 2224/37012* (2013.01); *H01L 2224/37013* (2013.01); *H01L 2224/40105* (2013.01); *H01L 2224/40245* (2013.01); *H01L 2224/40499* (2013.01); *H01L 2224/73213* (2013.01); *H01L 2224/73263* (2013.01); *H01L 2224/83001* (2013.01); *H01L 2224/8384* (2013.01); *H01L 2224/83191* (2013.01); *H01L 2224/83192* (2013.01); *H01L 2224/83203* (2013.01); *H01L 2224/83439* (2013.01); *H01L 2224/83447* (2013.01); *H01L 2224/83907* (2013.01); *H01L 2224/83986* (2013.01); *H01L 2224/84001* (2013.01); *H01L 2224/8484* (2013.01); *H01L 2224/84203* (2013.01); *H01L 2224/84986* (2013.01); *H01L 2224/9205* (2013.01); *H01L 2224/9221* (2013.01); *H01L 2224/97* (2013.01)

(56) References Cited

U.S. PATENT DOCUMENTS

| | | | |
|---|---|---|---|
| 2012/0061815 | A1* | 3/2012 | Sontheimer ......... H01L 23/3735 257/676 |
| 2012/0114927 | A1 | 5/2012 | Khaselev |
| 2014/0131898 | A1 | 5/2014 | Shearer et al. |
| 2016/0001388 | A1 | 1/2016 | Oohiraki et al. |
| 2017/0117209 | A1* | 4/2017 | Benedikt ................ H01L 24/40 |

FOREIGN PATENT DOCUMENTS

| | | |
|---|---|---|
| EP | 2966679 A1 | 1/2016 |
| JP | 2007214340 A | 8/2007 |
| WO | 2006072032 A2 | 7/2006 |
| WO | 2014027418 A1 | 2/2014 |
| WO | 2014136683 A1 | 2/2014 |

OTHER PUBLICATIONS

Rudzki, Jacek, "Aufbaukonzepte für die Leistungselektronik mit der Niedertemperatur-Verbindungstechnik," Chapter 2, "NTV-Kontaktschicht," Fortschr.-Ber. VDI Reihe 21 Nr. 376, Dusseldorf: VDI Verlag 2006, pp. 4-26.

* cited by examiner

Typical sintered joint
Composition: sintered silver particles
Density: 80-85%
Thermal Cond: ~200 WmK
Electrical Cond: ~3 µΩ-cm
Young Module: ~20GPa Materials:

Step1 - laminate clip and die with sinterable silver film

Step 2 - dispense tack agent on the substrate

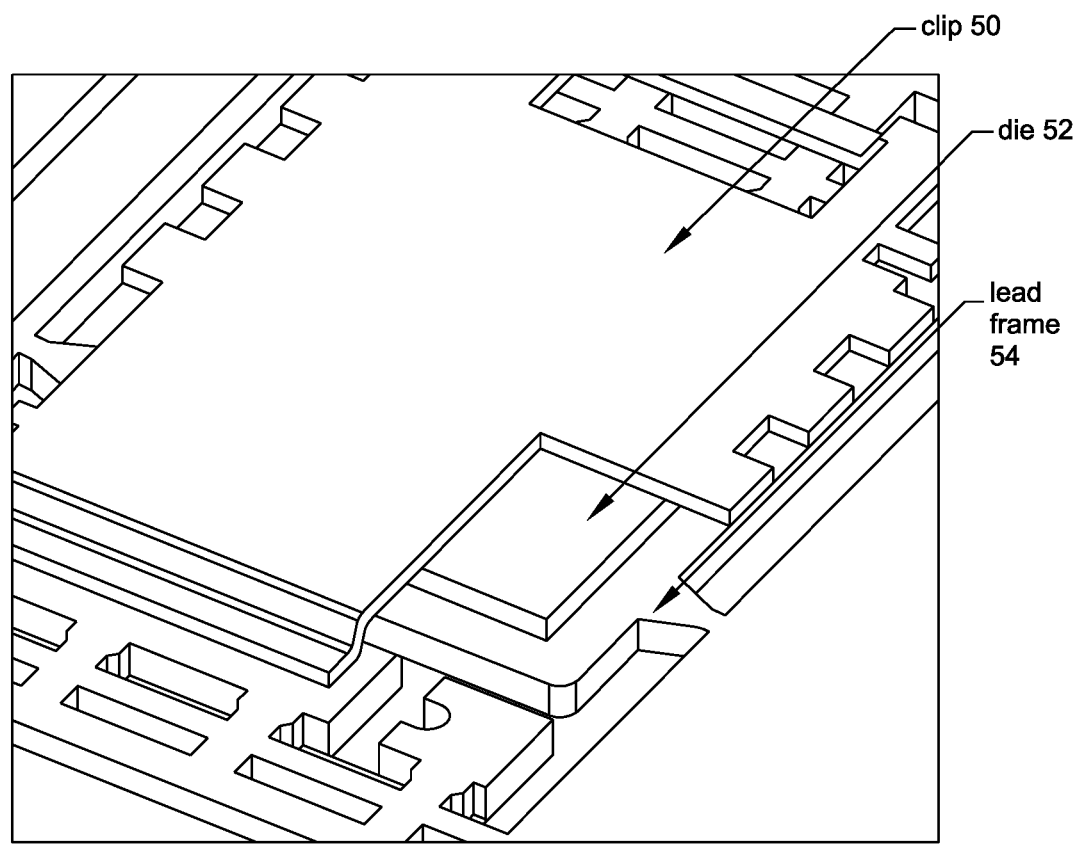
FIG. 5
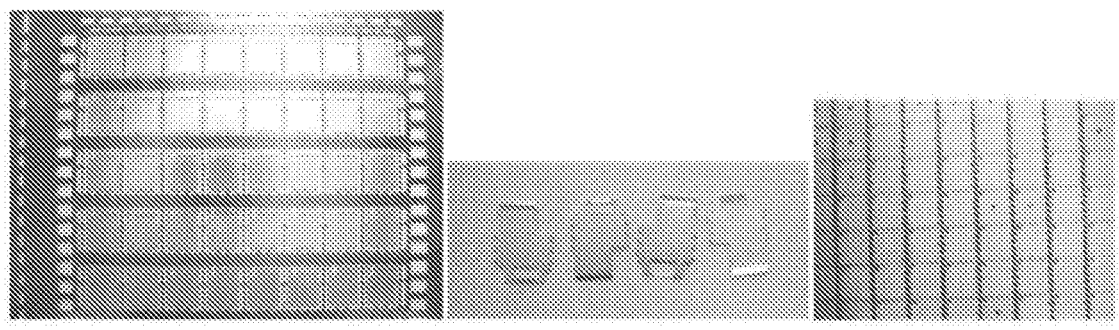
Lead Frame
FIG. 6A
Clips
FIG. 6B
Dies
FIG. 6C

Tack agent dispensed at the position to hold the die

Tack agent dispensed at the position to hold the clip

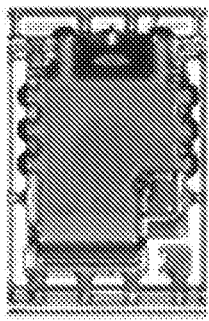 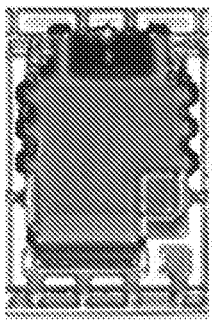 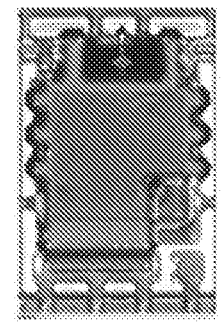 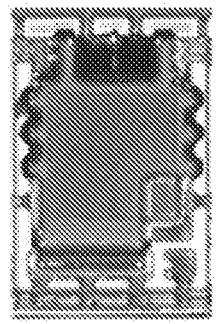
FIG. 9A　FIG. 9B　FIG. 9C　FIG. 9D
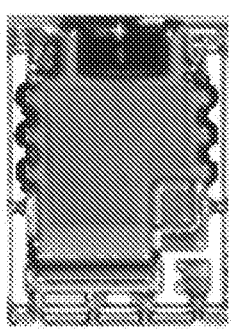 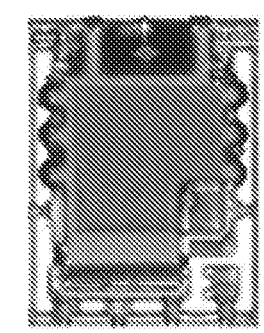 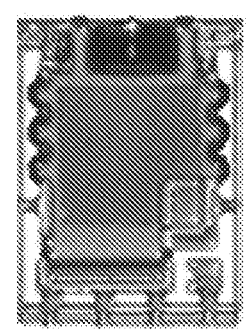 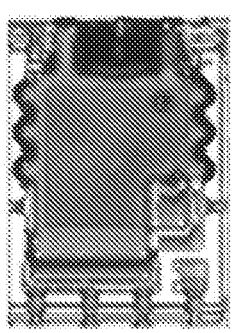
FIG. 9E　FIG. 9F　FIG. 9G　FIG. 9H
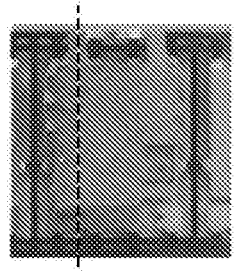 
FIG. 10A　FIG. 10B Lead frame with Clips prior to lamination
Lead frame with Clips after the lamination
Clips prior to lamination
Clips after lamination
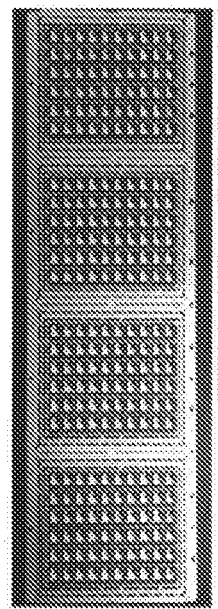
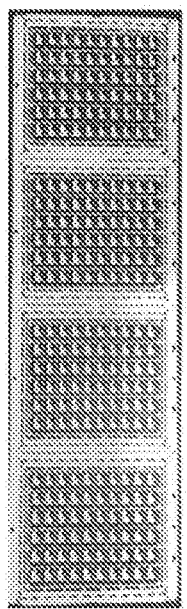
FIG. 12B
Laminated Sinterable Silver Layer
FIG. 13B
FIG. 12A
FIG. 13A

METHOD FOR DIE AND CLIP ATTACHMENT

RELATED APPLICATIONS

This application relates and claims priority to U.S. Provisional Patent Application Ser. No. 62/093,004, entitled "METHOD FOR DIE AND CLIP ATTACHMENT," filed Dec. 17, 2014, which is herein incorporated by reference in its entirety for all purposes.

BACKGROUND OF THE DISCLOSURE

This disclosure relates generally to methods for attachment of electronic components to a substrate or lead frame, and more specifically to methods incorporating sintering materials that are used to perform such methods.

Sintered silver die attach films combine unique physical properties of nanosilver powder and innovative chemical formulations into innovative products that allow joining various electronic devices to produce extremely reliable high thermal and electrical conductivity interfaces. Reference can be made to U.S. Patent Application Publication No. 2012/0114927 A1, which is incorporated herein in its entirety for all purposes, for processes in which sintered silver die attach films are uniquely positioned to fit into existing manufacturing equipment and processes to enable high volume manufacturing. This technology covers wide variety of devices and applications from large area thyristors and power modules for electrical and automotive equipment to miniature discrete components for mobile technology and LED lighting. The technology improves performance of existing devices by either increasing power or light output or reliability as compared to traditional joining techniques. The sintering films enable use of the new high temperature SiC and GaN semiconductors and new device designs that produce electrical efficiency unattainable with the existing technologies.

Silver die attach pastes and films are the joining materials that attach an electronic device to a passive substrate or to another device. A silver film is unique because it can be applied or laminated to an individual die, to the back side of the die or to the wafer. In one embodiment, the die is placed on the preheated substrate with a force sufficient to densify the film and establish intimate connection between the material and the connected parts. Under the applied heat and pressure, the film sinters and connects the die to the substrate. The resulting joint between the die and the substrate is metallic silver with the structure and properties shown with reference to FIG. 1.

In many semiconductor packages, an electrical connection of the device is provided through clip bonding to the top of the die. This arrangement ensures low electrical resistance of the package and improved performance compared to wire bonding. Clip bonding is done by soldering a copper clip to one or both bond pads and their corresponding leads. The process typically uses high lead solder material and requires a good control of the soldering process, especially the positioning of the die and clips during the molten phase of the solder reflow process.

SUMMARY

A process for die and clip attachment using sinterable silver films is well suited for high volume manufacturing of discrete packages. The process utilizes technology of dispensable tack agent to position the dies and clips on the lead frame before sintering. The clips can also be used in a matrix connected to a lead frame. The following sintering step can be done in any commercially available sinter press.

In one aspect of the present disclosure is directed to a method of die and clip attachment comprising: providing a clip, a die and a substrate; laminating a sinterable silver film on the clip and the die; depositing a tack agent on the substrate; placing the die on the substrate; placing the clip on the die and the substrate to create a substrate, die and clip package; and sintering the substrate, die and clip package.

Embodiments of the present disclosure further may include laminating the sinterable silver film with an application of a pressure of 2-3 MPa or higher and a temperature of 130° C. applied for 30 seconds. The die can be laminated individually or as a whole wafer followed by dicing. The clip can be laminated individually or in the form of a copper plate followed by dicing or stamping. Laminating the sinterable silver film can be done in a lamination press capable of providing specified pressure and temperature or in a die bonding machine. The laminated die may be collected and stored in a waffle pack or on a dicing tape. The laminated clip may be collected and stored on the tape, reel or waffle pack. The tack agent may be dispensed on the substrate to place and held in position the components of the package before the components have been moved to the sintering press. The tack agent provides temporary attachment of the die and the clip to the substrate. The tack agent evaporates during the sintering of the substrate, die and clip package without interference with the sintering process. The die may be placed on the substrate with a die bonder, and secured in the position with the tack agent. The clip may be placed on the substrate with a pick and place machine or an epoxy die bonder, and secured in the position with the tack agent. Sintering the substrate, die and clip package may include a sintering press having a pressure tool and a heated platen. Sintering may include application of a pressure of 10 MPa and a temperature of 250° C. for 60 seconds. Clips may be laminated with the sinterable silver film in a form of a matrix connected to the substrate. A spacing between the clips may be matched to the dies positioned on the substrate. A solder joint can be created by the method described herein. A clip can enables a uniform transfer of pressure to a die and a foot pad of a substrate.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIG. 5 is a schematic perspective view of a package having a die and clip attachment of an embodiment of the present disclosure;

FIGS. 6A-6C illustrate a lead frame, clips and dies of embodiments of the present disclosure;

FIGS. 9A-9H are photographic representations of joint analysis by CSAM;

FIGS. 10A and 10B are photographic representations of joint analysis by SEM;

FIG. 12A is a view of a lead frame with clips prior to lamination;

FIG. 12B is a view of clips prior to lamination;

FIG. 13A is a view of a lead frame with clips after lamination; and

FIG. 13B is a view of clips after lamination.

DETAILED DESCRIPTION

Figure 1:
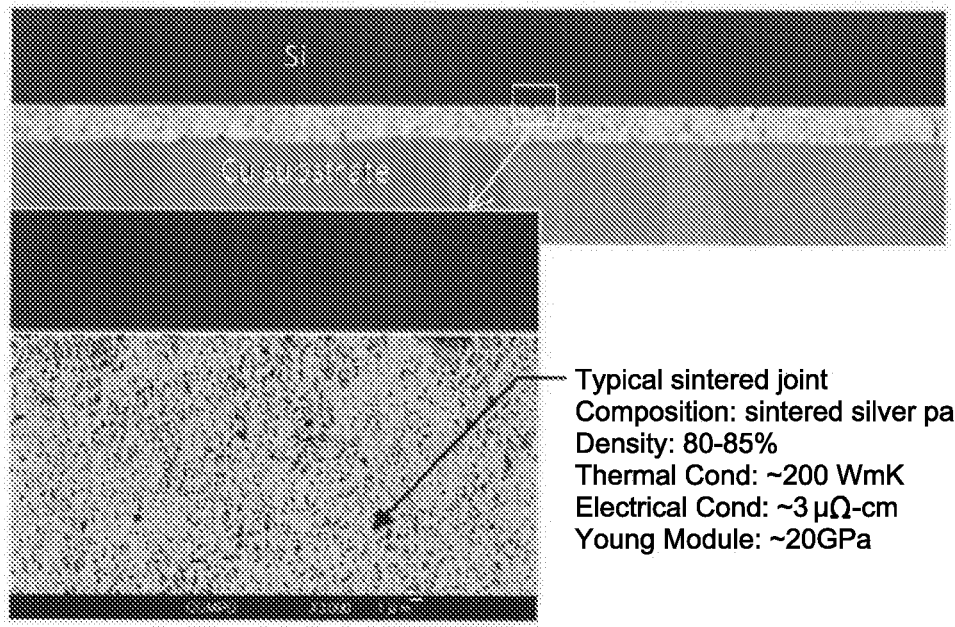
FIG. 1 is a photographic representation of a resulting joint between a die and a substrate that is metallic silver.
Figure 2A:
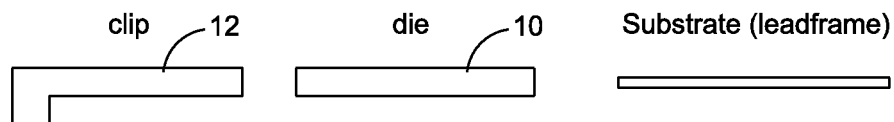
FIGS. 2A-2F are schematic views showing a process of die and clip attachment of an embodiment of the present disclosure.
Figure 2B:
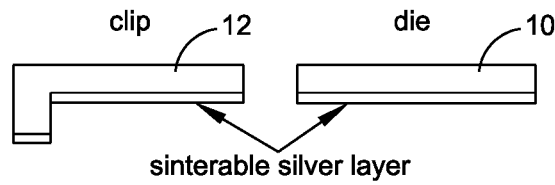
Figure 2C:
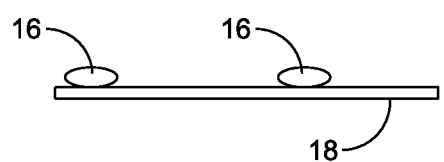
Figure 2D:
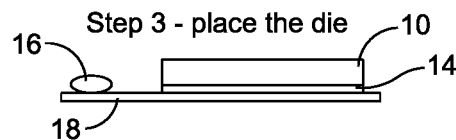
Figure 2E:
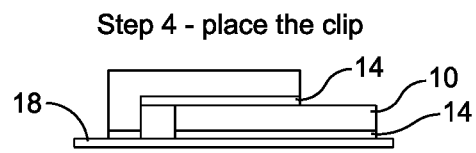
Figure 2F:
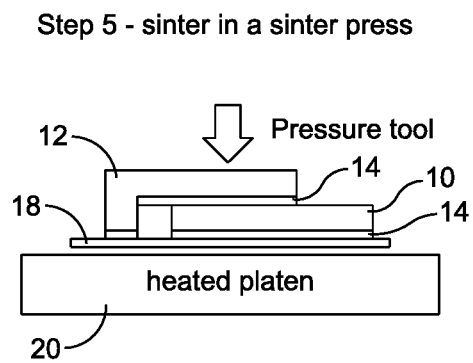

Sinter technology is an excellent alternative to the clip soldering since sintering provides void-free, high electrical and thermal conductivity bond and eliminates use of toxic lead containing solders. This disclosure describes a process uniquely suited for high volume manufacturing of clip attached power packages through the sintering process. The process of embodiments of the present disclosure utilizes capabilities of sinterable silver films and special tack agent to ensure accurate positioning and reliable connection of the components. A process of the die and clip attachment in a single step using pre-applied sinterable silver films is disclosed herein. The composition and use of the silver films are described in U.S. Patent Application Publication No. 2012/0114927 A1. The process is described schematically with reference to FIGS. 2A-2F, which shows a die 10 and a clip 12.

In certain embodiments, the materials used in the process (FIG. 2A) may include a die, a clip and a substrate, e.g., a lead frame. In a first step (FIG. 2B), two components of the package, namely a die 10 and a clip 12, are laminated with the sinterable silver film 14 according to the process described in U.S. Patent Application Publication No. 2012/0114927 A1. In certain embodiments, the laminating pressure can vary from 0.5-20 MPa at a temperature between 100-200° C. for less than 1 second to 90 seconds. In a particular embodiment, the lamination parameters may include a pressure of 2-3 MPa or higher, and a temperature of 130° C. applied for 30 seconds. The dies can be laminated individually or as a whole wafer followed by dicing. Similarly, the clips can be laminated individually or in the form of a copper plate followed by dicing or stamping. The lamination step can be done in a lamination press capable of providing specified pressure and temperature or in the die bonding equipment, such as a Datacon™ 2200 evo multi-chip die bonder offered by BE Semiconductor Industries N.V., or similar machine. The laminated dies are collected and stored in a waffle pack or on a dicing tape. The laminated clip are collected and stored on the tape, reel or waffle pack.

In a second step (FIG. 2C), a tack agent 16 is dispensed on a substrate (or lead frame) 18 to place and hold in position the components of the package before the parts have been moved to the sintering press. The role of the tack agent 16 is to provide temporary attachment of the die 10 and the clip 12 to the lead frame 18. During sintering process tack agent evaporates without interference with the sintering process.

In the next step (FIG. 2D), the die 10 is placed on the lead frame 18 and secured in the position due to the tack agent 16. The die placement can be done in an ESEC™ 2100 die bonder offered by BE Semiconductor Industries N.V., or similar equipment.

In the fourth step (FIG. 2E), the clip 12 is placed on the lead frame 18 using standard pick and place equipment or equivalent epoxy die bonder, such as an ESEC™ 2100. The clip 12 is secured in the position due to the tack agent. The clip placement can be done in a pick and place machine, such as a Fuji® pick and place machine, or similar equipment.

In the final step (FIG. 2F), the lead frame 18 populated with all the dies and clips is moved to the sintering press (heated platen 20). In certain embodiments, the sintering pressure can vary from 3-25 MPa at a temperature between 190-300° C. for 1-180 seconds. In one embodiment, the parts are sintered at a pressure of 10 MPa, and at temperature of 250° C. for 60 seconds. The sintering step can be done in Sinterstar™ Innovate-F-XL press machine from Boschman Technologies, or similar equipment.

Figure 3A:
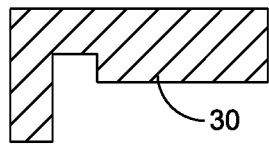
FIGS. 3A-3C are schematic cross-sectional views of clip designs of embodiments of the present disclosure.
Figure 3B:
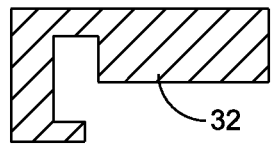
Figure 3C:
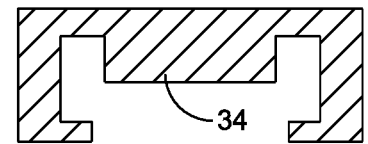
Figure 4A:
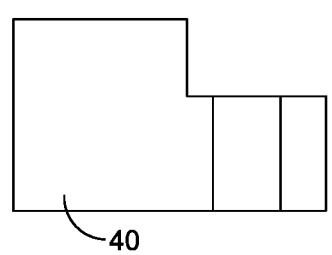
FIGS. 4A and 4B illustrate a clip design of an embodiment of the present disclosure.
Figure 4B:
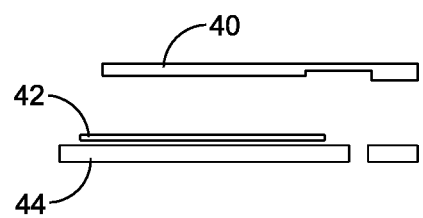

The shape of the clip can vary and depends on the die and lead frame design to accommodate electrical connections. The clip design can also account for thermal stress relieve due to the sintering process. Examples of clip designs are in FIGS. 3A, 3B and 3C. FIG. 3A illustrates clip 30. FIG. 3B illustrates clip 32. FIG. 3C illustrates clip 34. As shown, clips 30 and 32 are each configured with one leg to engage the lead frame. Clip 34 is configured with one leg to engage the lead frame. In a particular embodiment, the clip design may embody the design shown in FIGS. 4A and 4B. As shown, clip 40 is designed to secure die 42 and lead frame 44. It should be understood that any number of clip designs may be employed depending on the size and shape of the die and/or the lead frame.

Process Demonstration

Target Package

FIG. 5 illustrates a package having a die and clip attachment of an embodiment of the present disclosure. As shown, the package includes clip 50 and die 52, which are configured to be secured to lead frame 54.

Materials and Components

FIG. 6A illustrates an exemplary lead frame, FIG. 6B illustrates exemplary clip designs, and FIG. 6C illustrates exemplary dies of embodiments of the present disclosure. Silver films and tacking agents are also provided.

Process Details

The dies and the clips are laminated with sinterable silver film Argomax® 8020 from Alpha Metals, Inc. The tack agent was dispensed on the lead frame at the positions shown below. In one embodiment, the tack agent is sold under DATA 600 and is a commercial product of Alpha Metals, Inc.

Figure 7A:
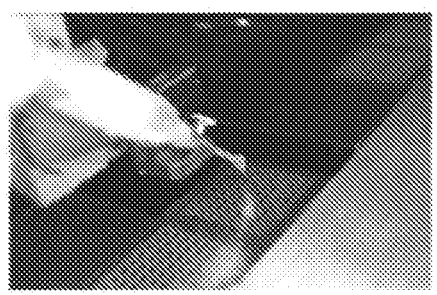
FIGS. 7A and 7B show a tack agent dispensed on a lead frame to hold a die and clip in place.
Figure 7B:
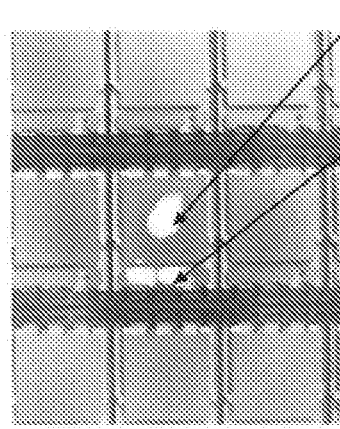

FIGS. 7A and 7B show a tack agent dispensed on a lead frame to hold a die and clip in place.

The dies and the clips are placed at eight positions on the lead frame and sintered in the sinter press Sinterstar™ from Boschman Technologies. The optical view from the top and the side of the packages indicated good sintered connection between the die and the substrate and the clip and the die.

The clip design is unique and allows for uniform pressure to transmit from a top of the clip to a die area and to a foot pad of the clip. Conversely, the die tool is unique and designed to apply uniform pressure across a top area of the clip. In this way the clip, die and substrate or lead frame can be sintered in one step.

In addition, the die tools, termed dynamic inserts, can be clustered in an array to apply uniform pressure across each individual die, a group of dies or all dies at once. Packages that are flat and three-dimensional packages can be processed effectively with the dynamic insert tool configuration. An array of lead frames or packages can be sintered in parallel with the only limitation being the press area.

The clip and tool design allows for high production throughput and yield. Therefore, cost targets can be achieved, with the benefit of high reliability and a lead-free system.

Figure 8A:
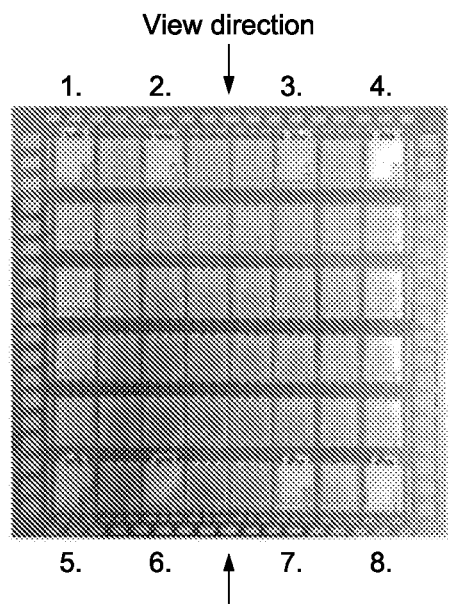
FIGS. 8A-8C are photographic representations of completed die and clip attachment assemblies of embodiments of the present disclosure.
Figures 8B, 8C:
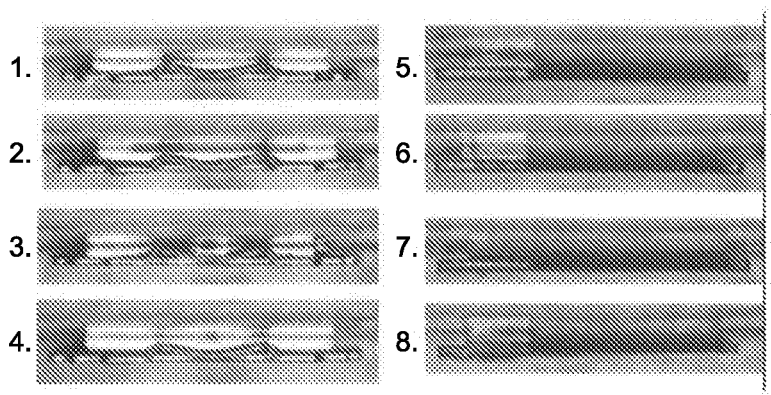
Figure 11A:
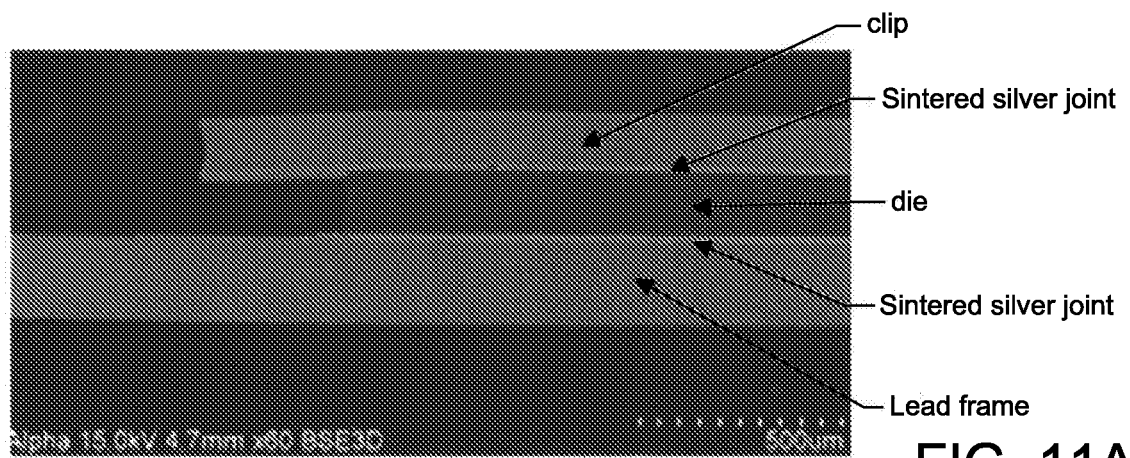
FIGS. 11A-11E are photographic representations of joint analysis of completed die and clip attachment assemblies.
Figure 11B:
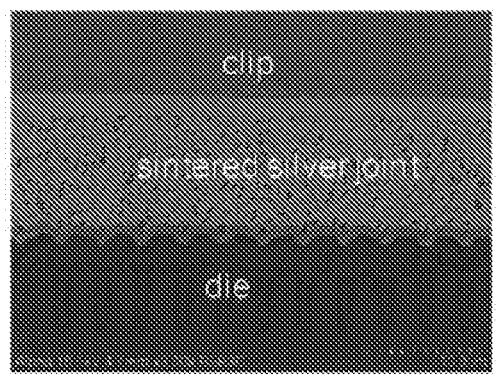
Figure 11C:
Figure 11D:
Figure 11E:

FIGS. 8A-8C are photographic representations of completed die and clip attachment assemblies of embodiments of the present disclosure.

Joint Analysis by Confocal Scanning Acoustic Microscopy (CSAM)

Scanning acoustic microscopy revealed uniform and full connection at both interfaces, namely the clip and the die and the die and the substrate.

FIGS. 9A-9H are photographic representations of joint analysis by CSAM.

Joint Analysis by Scanning Electron Microscope (SEM)

The attached components are cross sectioned and the connection examined using a scanning electron microscope. Both die and the clip are connected. Uniform fully sintered silver bond of about 15 µm is formed between the connected parts.

FIGS. 10A and 10B are photographic representations of joint analysis by SEM. FIGS. 11A-11E are photographic representations of joint analysis of completed die and clip attachment assemblies.

Process of Clip Lamination on a Lead Frame

Clips can be laminated with a sinterable silver layer individually as was described above or in a form of a matrix connected to the lead frame. In this case, the spacing between the clips is matched to the dies positioned on the substrate or lead frame. FIGS. 12A, 12B, 13A and 13B show an example of such a design before and after lamination. To attach the clips to the top side of the dies, the clip will be positioned and placed on the top of the substrate lead frame with the previously attached dies. Following sintering step is conducted similarly to what is described above.

FIG. 12A is a view of a lead frame with clips prior to lamination. FIG. 12B is a view of clips prior to lamination. FIG. 13A is a view of a lead frame with clips after lamination. FIG. 13B is a view of clips after lamination.

Alternatively, flat copper foil, with or without a silver plating layer, can be laminated with sinterable silver film. In a following step, copper foil can be trimmed and stamped to produce a lead frame with the clips shown in FIG. 13B.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of die and clip attachment comprising:
providing a clip, a die and a substrate;
laminating a sinterable silver film on the clip and the die under an application of a pressure of 0.5-3 MPa and at a temperature between 100-200° C. for less than 1 second, wherein the silver film comprises silver particles and silver is the only metallic component in the sinterable silver film;
depositing a tack agent on the substrate;
placing the die with the sinterable silver film thereon onto the substrate;
placing the clip on the die and the substrate to create a substrate, die and clip package;
and sintering the substrate, die and clip package, including sintering the sinterable silver film to convert the silver particles to a dense metal film, to form a metallic silver joint between the die and substrate.

2. The method of claim 1, wherein laminating the sinterable silver film includes an application of pressure of 2-3 MPa.

3. The method of claim 1, wherein laminating the sinterable silver film includes an application of pressure of 2-3 MPa or higher and a temperature of 130° C.

4. The method of claim 1, wherein the die is laminated individually or as a whole wafer followed by dicing.

5. The method of claim 1, wherein laminating the sinterable silver film is achieved in a lamination press capable of providing specified pressure and temperature or in a die bonding machine.

6. The method of claim 1, wherein the laminated die is collected and stored in a waffle pack or on a dicing tape.

7. The method of claim 1, wherein the tack agent is dispensed on the substrate to place and hold in position the components of the package before the components have been moved to the sintering press.

8. The method of claim 1, wherein the tack agent provides temporary attachment of the die and the clip to the substrate.

9. The method of claim 8, wherein the tack agent evaporates during the sintering of the substrate, die and clip package without interference with the sintering process.

10. The method of claim 1, wherein the die is placed on the substrate with a die bonder, and secured in the position with the tack agent.

11. The method of claim 1, wherein the clip is placed on the substrate with a pick and place machine or an epoxy die bonder, and secured in the position with the tack agent.

12. The method of claim 1, wherein sintering the substrate, die and clip package includes a sintering press having a pressure tool and a heated platen.

13. The method of claim 12, wherein sintering includes an application of a pressure from 3-25 MPa and a temperature between 190-300° C. from 1-180 seconds.

14. The method of claim 1, further comprising multiple clips, and wherein the clips are laminated with the sinterable silver film in a form of a matrix connected to the substrate.

15. The method of claim 14, wherein a spacing between the clips is matched to dies positioned on the substrate.

16. The method of claim 1 wherein:
the placing the die on the substrate is via the tack agent and the silver film;
the placing the clip on the die is via the silver film;
the placing the clip on the substrate is via the tack agent and the silver film; and
the tack agent provides temporary attachment of the die and the clip to the substrate.

17. A method of die and clip attachment comprising:
providing a clip, a die and a substrate;
laminating a sinterable silver film on the clip and the die under an application of a pressure of 0.5-3 MPa and at a temperature between 100-200° C. for less than 1 second, wherein the silver film comprises silver particles and silver is the only metallic component in the sinterable silver film;
placing the die with the sinterable silver film thereon onto the substrate;
placing the clip on the die and the substrate to create a substrate, die and clip package; and
sintering the substrate, die and clip package, including sintering the sinterable silver film to convert the silver particles to a dense metal film, to form a metallic silver joint between the die and substrate.

18. The method of claim 17, wherein laminating the sinterable silver film includes an application of pressure of 2-3 MPa.

19. The method of claim 17, wherein sintering includes an application of a pressure from 3-25 MPa and a temperature between 190-300° C. from 1-180 seconds.

* * * * *